United States Patent
Havens et al.

[11] Patent Number: 6,014,069
[45] Date of Patent: Jan. 11, 2000

[54] SUPERCONDUCTING MAGNET CORRECTION COIL ADJUSTMENT MECHANISM

[76] Inventors: Timothy John Havens, 1208 Madison Ave.; Xianrui Huang, 1017 Oak Chase Lane; Minfeng Xu, 717 Rice Hope Cove, all of Florence, S.C. 29501

[21] Appl. No.: 09/216,618

[22] Filed: Dec. 18, 1998

[51] Int. Cl.[7] .................................................. H01F 1/00
[52] U.S. Cl. ........................... 335/216; 335/301; 324/318
[58] Field of Search ..................................... 335/216, 299, 335/300, 301; 324/318, 319, 320, 321, 322; 505/872, 875

[56] References Cited

U.S. PATENT DOCUMENTS

| | | | |
|---|---|---|---|
| 4,173,775 | 11/1979 | Kneip, Jr. .................................. | 361/141 |
| 4,535,291 | 8/1985 | Lee et al. ................................. | 324/320 |
| 4,737,717 | 4/1988 | Petro ........................................ | 324/320 |
| 4,812,797 | 3/1989 | Jayakumar ............................... | 335/299 |
| 5,539,367 | 7/1996 | Xu et al. .................................. | 335/301 |
| 5,545,997 | 8/1996 | Westphal et al. ....................... | 324/320 |

*Primary Examiner*—Lincoln Donovan
*Assistant Examiner*—Tuyen T. Nguyen
*Attorney, Agent, or Firm*—Irving M. Freedman; Christian G. Cabou; Phyllis Y. Price

[57] ABSTRACT

A correction coil current adjustment circuit for a superconducting magnet to selectively switch various coils in circuit with a power source to provide the desired superconducting current flow and magnetic field homogeneity for magnetic resonance imaging eliminating the need for some of the mechanical leads which extend from the exterior of the magnet to the interior of the cryogen vessel minimizing thermal leak paths and including simplified switching of the various main and correction magnet coils to provide the desired current flow. Inductive coupling from outside the magnet to induce correction coil current flow eliminates additional mechanical leads.

18 Claims, 3 Drawing Sheets

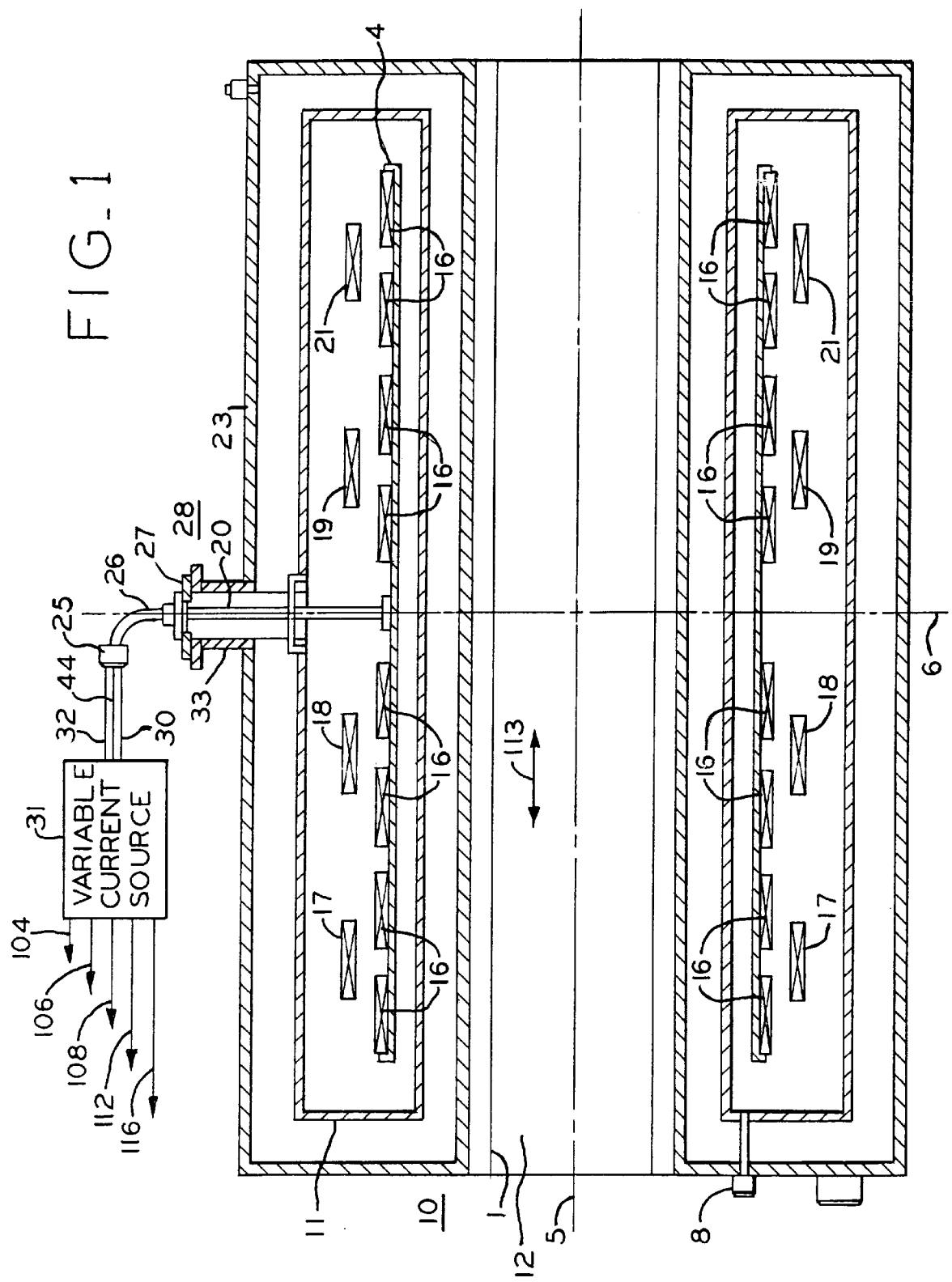

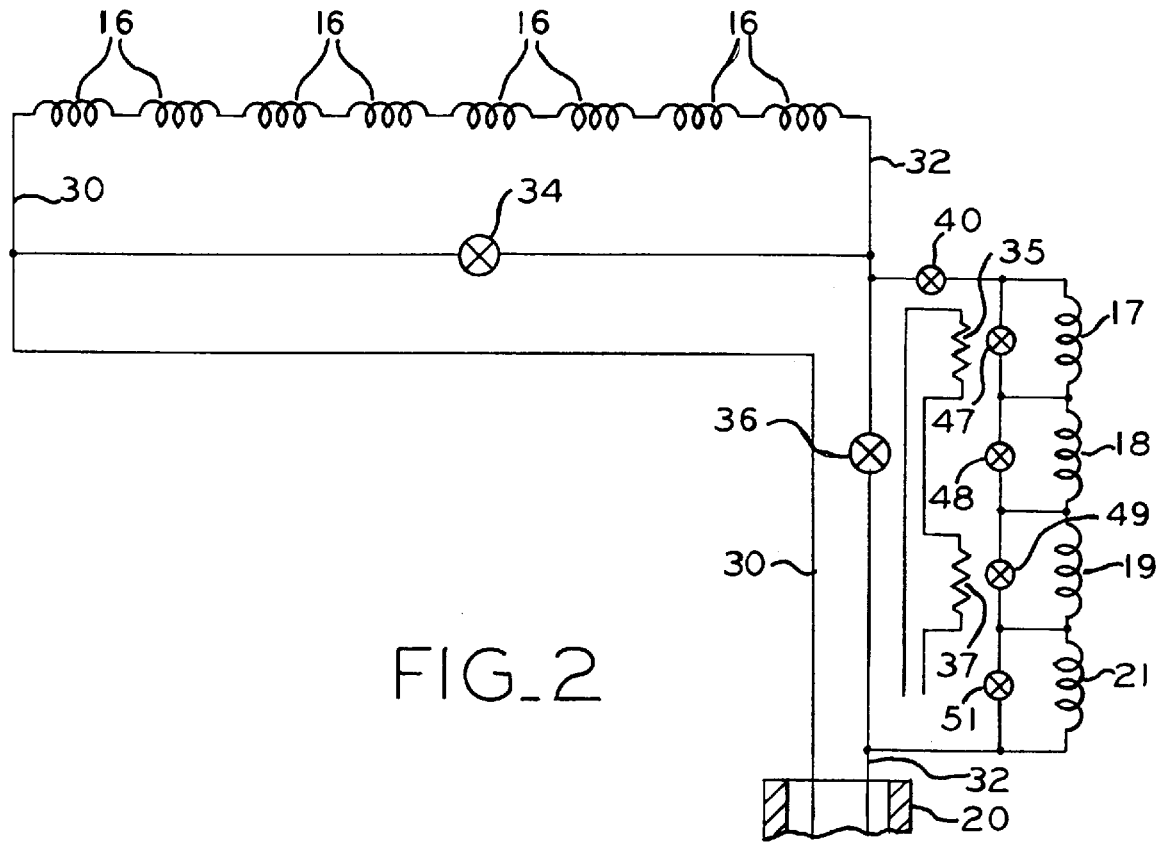
FIG_2
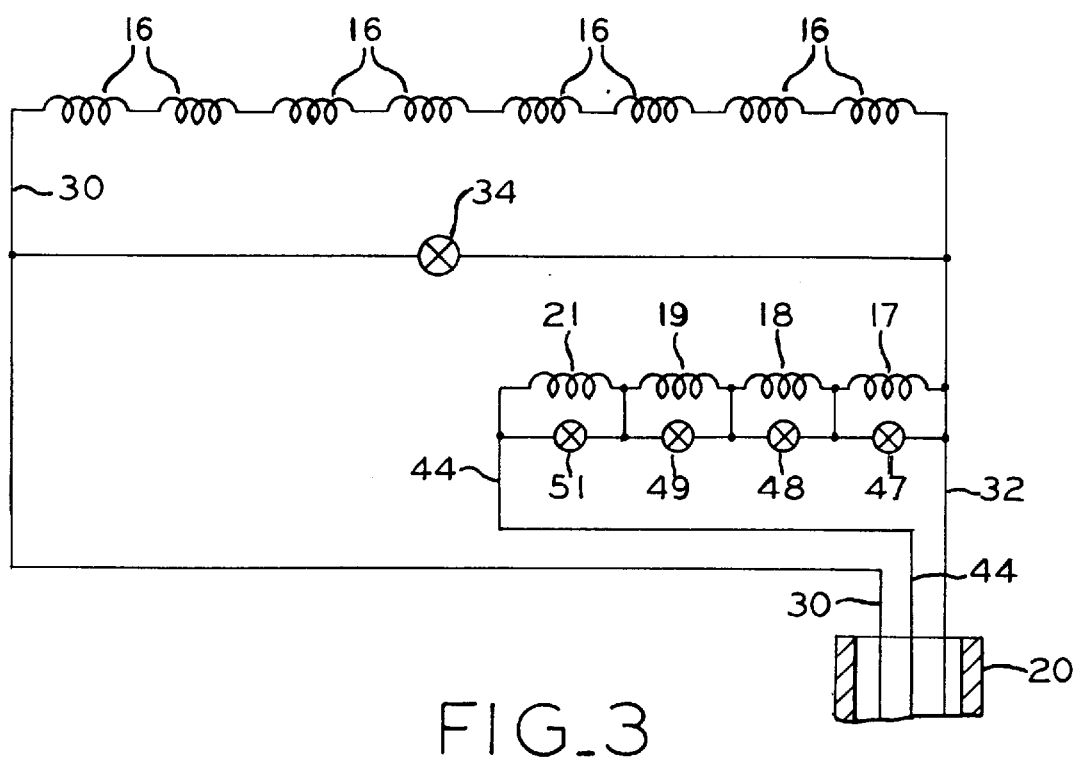
FIG_3

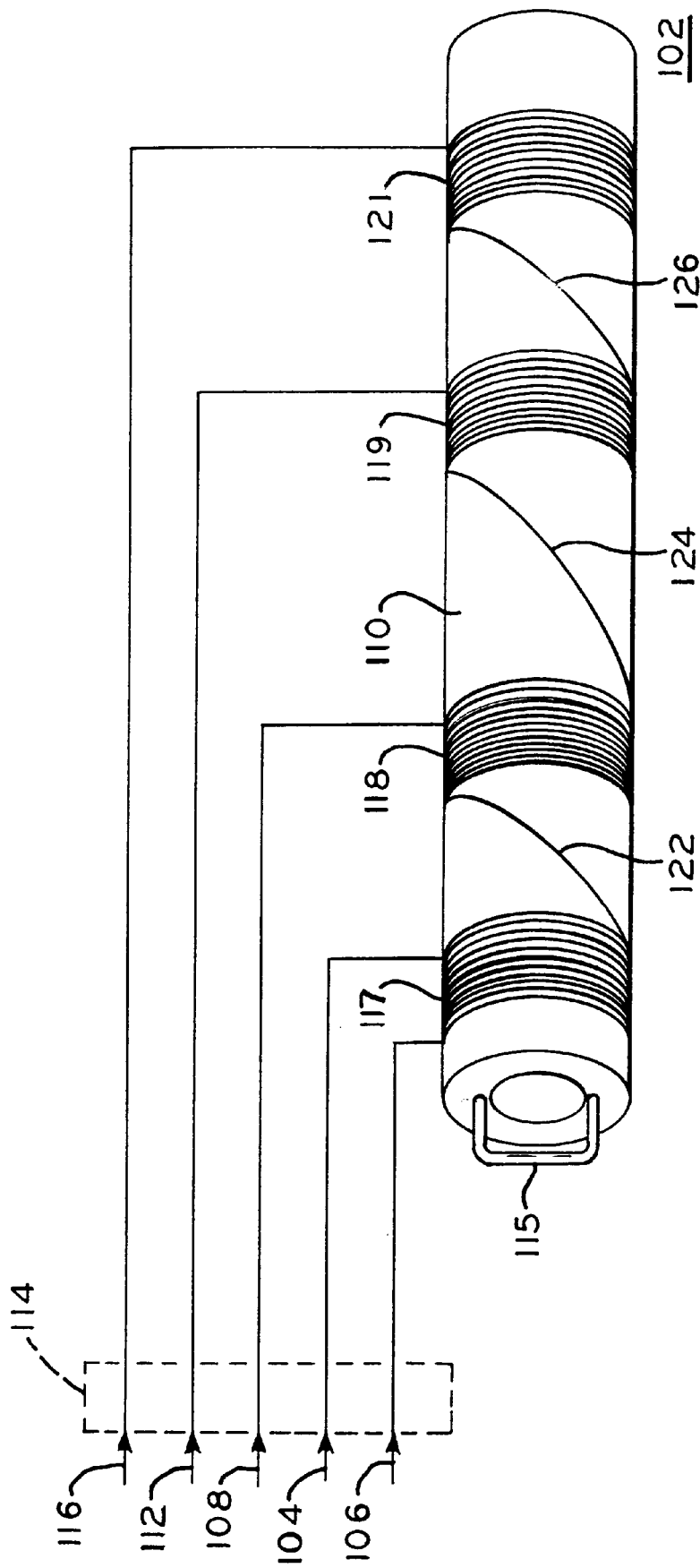
FIG._4

SUPERCONDUCTING MAGNET CORRECTION COIL ADJUSTMENT MECHANISM

BACKGROUND OF INVENTION

This invention relates to superconducting magnet assembly for a magnetic resonance imaging system (hereinafter called "MRI"), and more particularly to compensation for magnetic inhomogeneities through control of flow in correction coils in the magnet.

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that the coils can be operated in persistent mode, that is, a power supply can be connected for a short time to start current flowing through the coils, then a superconducting switch can be closed, the power supply removed, and the current will continue to flow, thereby maintaining the coils current and resultant magnetic field. Superconducting magnets find wide application in the field of MRI.

In a typical MRI magnet, the main superconducting magnet coils are enclosed in a cylindrical cryogen pressure vessel, contained within a vacuum vessel and forming an imaging bore in the central region. The main magnet coils develop a strong magnetic field in the imaging bore.

However, it is necessary for acceptable quality imaging to provide and maintain a strong homogeneous magnetic field in the imaging region. Typical field strengths of 0.5 to 1.5 T require homogeneity of 10 parts per million (ppm) over volumes on the order of a 45 cm diameter sphere. While magnets can be designed to produce these field strengths and this level of homogeneity, achievable manufacturing tolerances are too large to guarantee that the manufactured magnet will meet the 10 ppm homogeneity requirements. One method of achieving high magnetic field strength and high homogeneity is to build the magnet of superconducting wires and add magnetic "shimming". One method to "shim" the magnet is to add small amounts of magnetic material (called shims) such as ferromagnetic low carbon steel to appropriate places near the imaging volume. While this method typically saves magnet cost, the additional ferromagnetic material has unwanted effects including force. As more magnetic material is added, the force on the magnetic material increases. Another unwanted effect is that the magnetic properties of magnetic material shims are temperature dependent such that as the amount of magnetic material increases, the unwanted temperature, effects increase.

Another shimming method is to add superconducting correction coils to the magnet. The currents in these correction coils can then be adjusted after the magnet has completed manufacture to "shim" the magnet to the required homogeneity. However, superconducting wire must be maintained at cryogenic temperatures, and present arrangements for adjusting the current in the correction coils add significant, unwanted cost and complexity to the magnet. In addition to the unwanted cost and complexity, mechanical leads which extend from the outside of the superconducting magnet to the interior of the cryogen vessel also add a thermal load to the refrigerators that recycle the helium gas produced back to liquid helium to maintain the superconducting magnet at cryogenic temperatures.

SUMMARY OF INVENTION

A magnetic field correction coil current control for a superconducting magnet to improve homogeneity of the magnetic field of the magnet utilizing a variable current source and shunt switching to minimize the mechanical leads necessary to pass current from outside the magnet to the coils to minimize thermal conductive leakage paths. Shunt switches parallel the main field series connected coils and each of the correction coils to enable selective controlled current flow through each of the correction coils. Inductive coupling of current flow from control coils positioned within the magnet bore outside the magnet eliminates additional mechanical leads.

DESCRIPTION OF DRAWINGS AND INVENTION

FIG. 1 is a simplified cross-sectional view of a superconducting magnet incorporating the invention.

FIG. 2 is a schematic showing of the electrical interconnection of the correction coils within the cryogen vessel of FIG. 1.

FIG. 3 is an alternate switching arrangement for the electrical interconnection of the correction coils of FIGS. 1 and 2.

FIG. 4 shows apparatus to inductively couple current flow in the correction coils of FIGS. 1 and 2.

Referring first to FIG. 1, superconducting magnet assembly 10 includes cryogen pressure vessel 11 concentrically within vacuum vessel 23 forming a central imaging bore 12 about axis 5. Positioned within pressure vessel 11 is composite drum 4 with axially spaced main magnet coils 16 wound in axial slots on the drum. Correction coils 17, 18, 19 and 21 within pressure vessel 11 enable shimming of the magnetic field in bore 12 to improve magnetic field homogeneity to acceptable limits.

External electrical power and control connections are provided through access port 28 by lead assembly 26 which includes connector 25 outside vacuum vessel 23 and conduit 20 passing through plate 27 for electrical connection of mechanical leads or wires (shown in FIGS. 2 and 3) to the components including magnet coils 16, 17, 18, 19 and 21 within cryogen pressure vessel 11.

Referring next to FIG. 2, main magnet coils 16 are connected in series between mechanical leads 30 and 32 which pass through conduit 20 (see FIG. 1) from variable current source 31 outside magnet assembly 10 to the interior of cryogen pressure vessel 11. For simplicity of drawing the schematic connections of FIGS. 2 and 3 show conduit 20 at the bottom rather than at the top of the figure as in FIG. 1. Correction coils 17, 18, 19 and 21 and switch 40 are connected in series across shunting switch 36 which is connected in series with lead 32.

Shunt switches 47, 48, 49 and 51 are each connected in parallel with correction coils 17, 18, 19 and 21, respectively, to enable selective shunting of individual correction coils. Separately adjusting correction coils 17, 18, 19 and 21 to provide the desired shimming current after main magnet coils 16 have been rendered superconducting is accomplished by selective operation of switches 34, 36, 40, 47, 48, 49 and 51 as described below. The closing of main magnet coil shunt switch 34 and the opening of correction coil shunt switch 36 transfers the desired constant current flow provided by variable current source 31 from the main magnet coils 16 to the circuit including correction coils 17, 18, 19 and 21. Current is sequentially flowed through a desired correction coil by closing three of the shunt switches 47, 48, 49 and 51 and leaving open the shunt switch which parallels the coil through which current flow is desired. For example, to provide shimming current flow to correction coil 17, correction coils series switch 40 is closed and shunt switch 47 is open while shunt switches 48, 49 and 51 are closed shunting correction coils 18, 19 and 21 to provide current flow only through correction coil 17 with the adjustment of variable current source 31 providing the desired current flow through correction coil 17 for proper shimming of adjacent main magnet coils 16. After the proper current is established in correction coil 17, switch 47 is closed to maintain constant current in correction coils 17.

The remainder of correction coils 18, 19 and 21 are similarly adjusted by shunting current past all of the main magnet and some of the correction coils by closing their shunt switches and opening the shunt switch of only the correction coil being provided with appropriate current flow for proper shimming, such as selectively opening switches 48, 49 or 51.

Referring next to FIG. 3. The circuitry of FIG. 3 avoids the use of correction coil switch 36 and correction coils series switch 40 by connecting correction coils 17, 18, 19 and 21 in series between a separate lead or connection 44 and lead 32 to variable current source 31. Correction coils 17, 18, 19 and 21 can be selectively connected in circuit with variable current source 31 by simply opening the shunt switch or switches across the correction coils for which current flow is desired. It is to be noted that mechanical lead 32 is common to both main magnet coils 16 circuit and correction coils 17, 18, 19 and 21 circuit.

When the shimming operation is complete and provides the corrected and required magnetic field homogeneity in imaging bore 12 all of the shunt switches are put in the closed position for sustained superconducting operation.

It is to be noted that only two mechanical leads 30 and 32 in FIGS. 1 and 2, and three mechanical leads 30, 44 and 32 in FIG. 3 extend from outside magnet assembly 10 through access port 28 and conduit 20 to energize all of the main magnet coils 16 and correction coils 17, 18, 19 and 21. This minimizes heat conduction and thermal losses from the leads. This also avoids the cost and complexity of existing correction coil circuits in energizing all of the correction coils.

Thus, current is caused to flow through main magnet coils 16 by opening shunt switch 34 or a desired current flow from variable current source 31 is caused to flow through correction coils 17, 18, 19 and 21 by opening the appropriate correct coil shunt switches.

It is possible to have multiple parts of a correction coil positioned at multiple locations to enable the use of a number of correction coils actuated by fewer shunt switches.

The actuation of the shunting switches 34, 36, 40, 47, 48, 49 and 51 is accomplished in any manner well known in the art such as simply using a length of superconducting wire to shunt the correction coil with an associated heater. The resistance of such a wire shunt is zero when cold but when heated is greater than zero. When the desired current in the correction coil has been reached, the heater is turned off and the superconducting current in the correction coil will continue to circulate through the wire shunt switch and through the correction coil. Heaters 35 and 37 in FIG. 2 illustrates such as a heater or "ramp" coil associated with, and in thermal relationship to, shunt switches 47 and 49. It is thus sometimes possible to provide banks of switches heated at the same time to further minimize connecting leads.

In order to eliminate additional mechanical leads to provide controlled current flow through correction coils 17, 18, 19 and 21, the controlled current may be inductively induced through use of the apparatus shown in FIG. 4.

Referring to FIG. 4, cylindrical coils form 110 of control current assembly 102 is dimensioned to slide within bore 12 of superconducting magnet assembly 10 (see FIG. 1) as indicated by arrow 113. Control coils 117, 118, 119 and 121 are wound within slots on coil form 110 and are positioned and configured so that they are adjacent to correction coils 17, 18, 19 and 21 although inside bore 12. Handle 114 facilitates the proper insertion and positioning of assembly 102.

Current flow through control coils 117, 118, 119 and/or 121 is inductively coupled to the corresponding correction coil. That is, for example, control coil current flow through control coil 117 can be inductively coupled to correction coil 17 in superconducting magnet assembly 10 with the shunt switch 47 opened as described above to enable current flow through correction coil 17.

In order to enhance the inductive coupling, control coils 117, 118, 119 and 121 are positioned within bore 12 of superconducting magnet assembly 10 to be closely adjacent to the inner walls of vacuum vessel 23 to minimize the distance between the control coils and their corresponding correction coils 17, 18, 19 and 21, respectively. Control coils 117, 118, 119 and 121 are connected in series by jumpers 122, 124 and 126, such that current flow through control coil 117 is provided from variable current source 31 through connector 114 and through leads 106 and 104; current flow through control coil 118 is provided through leads 104 and 108; current flow through control coil 119 is provided through leads 108 and 112; and current flow through control coil 121 is provided through leads 112 and 116.

Control coils 117, 118, 119 and 121 can be configured and positioned on coil form 110 to provide maximum inductive coupling to their respective correction coils. Correction currents in correction coils 17, 18, 19 and 21 are in the order of less than 20 amps.

Thus, the desired amount of correction current flow for each of correction coils 17, 18, 19 and 21 can be controlled and adjusted by providing the appropriate corresponding current flow in control coils 117, 118, 119 and 121, respectively, from variable current source 31.

By way of summary, the proper correction current flow through coils 17, 18, 19 and 21 can be inductively coupled by positioning control current assembly 102 into bore 12 and providing appropriate current flow through control coils 117, 118, 119 and 121 and while shunt switches such as 35, 47, 48, 49 and 51 are appropriately activated to enable the inductively coupled or induced correction coil current. Inductive coupling eliminates the need for mechanical leads such as 30, 32 and 44 to be connected to correction coils 17, 18, 19 and 21.

The correction coil current control and circuitry described above minimizes the mechanical leads extending from the coils on the interior of cryogen vessel 11 to variable voltage source 31 outside vacuum vessel 23 and the thermal conductive path provided by each such lead, lessening the thermal load on the system. In addition, cost and complexity of the correction coil circuitry are reduced by the subject invention which also reduces the cost and complexity of adjusting the currents in the correction coils.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. In a superconducting magnet suitable for magnetic resonance imaging and including a plurality of main magnet coils and magnet field correction coils in a cryogen vessel and surrounding an imaging bore; a magnetic field correction coil control for adjusting correction coil current flow to improve the homogeneity of the magnetic field in said imaging bore including:

a variable current source external to said cryogen vessel selectively connected through no more than 3 leads passing through said cryogen vessel to said main magnet coils and said correction coils for introducing a current flow in said coils for superconducting operation; and switching means to selectively divert said variable current source to said magnetic field correction coils to cause a controlled superconducting current flow through said magnetic field corrections coils;

said switching means including selectively operated shunts across a plurality of said magnetic field correction coils to connect selected coils in circuit with said variable current source;

whereby the number of said leads between said power supply and said coils and their associated thermal loss is minimized.

2. The correction coil current control of claim 1 wherein said main magnet coils are connected in series with a main magnet coil shunting switch across said main magnet coils to divert current flow to said magnetic field correction coils when said main magnet shunting switch is closed.

3. The correction coil current control of claim 2 wherein said correction coils are connected in series and means are provided to selectively shunt some of said correction coils to direct adjustable current flow through the correction coils which are not shunted.

4. The correction coil current control of claim 3 wherein said selectively operated shunts include superconducting wire which is selectively heated to raise the temperature of the shunt and switch the wire to a resistive state.

5. The correction coil current control of claim 4 wherein a correction coil shunt switch is connected across each correction coil enabling the directing of adjustable current flow from said variable current source to a selected coil by shunting the other coils while not shunting said selected coil.

6. The correction coil current control of claim 5 wherein said correction coil shunt switch is connected in series with said correction coil series circuit, and a correction coil shunt switch is connected across said switch and correction coils circuit enabling said correction coils to be selectively connected to said variable current source individually and in groups.

7. The correction coil current control of claim 6 wherein said correction coil series circuit is selectively shunted to enable current to be provided through said main magnet coils with said main magnet shunt coil switch opened.

8. The correction coil current control of claim 4 wherein one end of said correction coil series circuit is connected to one end of said main magnet coils series circuit and the other end of said correction coils is connected through an additional mechanical lead to said variable current source.

9. The correction coil current control of claim 8 wherein a correction coil shunt switch is connected across each correction coil enabling current flow to be directed through one or more selected correction coils by opening the correction coil shunt switch across said one or more correction coils.

10. In a superconducting magnet suitable for magnetic resonance imaging and including a plurality of main magnet coils and magnet field correction coils in a cryogen vessel surrounding an imaging bore;

a magnetic field correction coil control for adjusting correction coil current flow to improve the homogeneity of the magnetic field in said imaging bore including:
       a variable current source external to said cryogen vessel selectively connected to said main magnet coils and said magnet field correction coils provide current flow in said coils for introducing the desired current through no more than 3 leads connecting said external current source and said coils through said cryogen vessel for superconducting operation of the coil receiving current from said current source; and
       selectively actuated switching means to shunt current flow around non-selected coils and divert current flow from said current source to others of said coils which are not shunted.

11. The correction coil current control of claim 10 wherein said main magnet coils are connected in series with a main magnet coil shunting switch across the series to divert current flow to said correction coils when the main magnet coil shunting switch is closed.

12. The correction coil current control of claim 11 wherein said magnet field correction coils are connected in series and shunt switches are provided across portions of the correction coils series circuit to selectively shunt a portion of said magnet field correction coils to direct adjustable current flow through the correction coils which are not shunted.

13. The correction coil current control of claim 10 wherein said correction coils are inductively coupled to said variable current source through selected current flow through selectively removable control coils positioned outside said superconducting magnet to provide superconducting current flow in said correction coils without the need for mechanical leads penetrating said superconducting magnet to provide said correction coils current flow current, after which said control coils are removed.

14. The correction coil current control of claim 13 wherein said control coils are positioned within said bore of said superconducting magnet to enable the inductive coupling.

15. The correction coil current control of claim 14 wherein said control coils are wound on a cylindrical form which is selectively positioned within said bore to provide said inductive coupling.

16. The correction coil current control of claim 1 wherein said correction coils are inductively coupled to said variable current source through selected current flow through control coils outside said superconducting magnet to provide current flow in said correction coils without the need for mechanical leads penetrating said superconducting magnet to provide said correction coil current flow.

17. The correction coil current control of claim 10 wherein said selectively actuated switching means include superconducting wire which is selectively heated to raise the temperature of the shunt and switch the wire to a resistive state.

18. The correction coil current control of claim 17 wherein one end of the main magnet coil series circuit and one end of said correction coil series circuit are connected together with at least one shunt switch across at least part of each of the two series circuits.

* * * * *